United States Patent
Mitrovic et al.

(10) Patent No.: US 7,230,204 B2
(45) Date of Patent: Jun. 12, 2007

(54) METHOD AND SYSTEM FOR TEMPERATURE CONTROL OF A SUBSTRATE

(75) Inventors: Andrej Mitrovic, Phoenix, AZ (US); Yuji Tsukamoto, Wilmington, MA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/551,236

(22) PCT Filed: Mar. 17, 2004

(86) PCT No.: PCT/US2004/006078

§ 371 (c)(1), (2), (4) Date: Sep. 27, 2005

(87) PCT Pub. No.: WO2004/095531

PCT Pub. Date: Nov. 4, 2004

(65) Prior Publication Data

US 2006/0175305 A1 Aug. 10, 2006

Related U.S. Application Data

(60) Provisional application No. 60/458,043, filed on Mar. 28, 2003.

(51) Int. Cl.
*B23K 10/00* (2006.01)
(52) U.S. Cl. .................. 219/121.58; 219/486; 219/483; 324/763; 118/724; 156/345.52
(58) Field of Classification Search .............. 219/494, 219/483–486, 497, 499, 501, 505; 118/723, 118/724; 324/763; 156/345.27, 345.21, 156/345.52, 345.53
See application file for complete search history.

(56) References Cited

U.S. PATENT DOCUMENTS

| | | | |
|---|---|---|---|
| 5,420,521 A * | 5/1995 | Jones | 324/760 |
| 5,958,140 A | 9/1999 | Arami et al. | |
| 6,080,969 A | 6/2000 | Goto et al. | |
| 6,084,215 A * | 7/2000 | Furuya et al. | 219/444.1 |
| 6,639,189 B2 | 10/2003 | Ramanan et al. | |
| 6,847,014 B1 | 1/2005 | Benjamin et al. | |
| 6,886,976 B2 * | 5/2005 | Gaasch et al. | 374/5 |

* cited by examiner

*Primary Examiner*—Mark Paschall
(74) *Attorney, Agent, or Firm*—Oblon, Spivak, McClelland, Maier & Neustadt, P.C.

(57) ABSTRACT

A substrate holder for supporting a substrate in a processing system and controlling the temperature thereof is described. The substrate holder comprises a first heating element positioned in a first region for elevating the temperature of the first region. A second heating element positioned in a second region is configured to elevate the temperature in the second region. Furthermore, a first controllably insulating element is positioned below the first heating element, and is configured to control the transfer of heat between the substrate and at least one cooling element positioned therebelow in the first region. A second controllably insulating element is positioned below the second heating element and is configured to control the transfer of heat between the substrate and at least one cooling element positioned therebelow in the second region.

40 Claims, 11 Drawing Sheets

METHOD AND SYSTEM FOR TEMPERATURE CONTROL OF A SUBSTRATE

CROSS-REFERENCE TO RELATED APPLICATIONS

This application claims priority to and is related to U.S. Provisional Application Ser. No. 60/458,043, filed on Mar. 28, 2003, which is related to pending U.S. patent application Ser. No. 10/168,544, filed Jul. 2, 2002. The entire contents of each of these applications are incorporated herein by reference.

FIELD OF THE INVENTION

The present invention relates to a method and system for temperature control of a substrate, and more particularly to a substrate holder for temperature control of a substrate.

BACKGROUND OF THE INVENTION

Throughout the various stages of substrate processing, such as semiconductor or display manufacturing, etc., critical process parameters may vary significantly. Processing conditions and their spatial distributions change over time with the slightest changes in critical process parameters creating undesirable results. Small changes can easily occur in the composition or pressure of a process gas, or substrate temperature, and the spatial distributions thereof. As such, substrate processing components require constant monitoring, and the ability to tightly control these processing conditions and their spatial distributions.

SUMMARY OF THE INVENTION

A method and system for temperature control of a substrate is described. The system for temperature control of the substrate comprises a substrate holder for supporting the substrate in a processing system and controlling the temperature thereof. The substrate holder comprises a first heating element arranged in a first region of the substrate holder and configured to raise the temperature in the first region; a second heating element configured to raise the temperature in the peripheral region; a first controllably insulating element positioned below the first heating element in the first region; a second controllably insulating element positioned below the second heating element in the second region; and at least one cooling element arranged below the first and second controllably insulating elements, wherein the first controllably insulating element is configured to control the transfer of heat from the substrate through the first region of the substrate holder to the at least one cooling element, and the second controllably insulating element is configured to control the transfer of heat between the substrate through the second region of the substrate holder to the at least one cooling element.

In one embodiment of such a system, the first region is a central region, and the second region is a peripheral region arranged concentrically about the first region.

The method comprising: initializing one or more control parameters for controlling the temperature of the substrate using the substrate holder, the one or more control parameters for controlling the temperature of the substrate using the substrate holder; initiating a process in the processing system; adjusting the one or more control parameters; and terminating the process.

BRIEF DESCRIPTION OF THE DRAWINGS

These and other advantages of the invention will become more apparent and more readily appreciated from the following detailed description of the exemplary embodiments of the invention taken in conjunction with the accompanying drawings, where.

DETAILED DESCRIPTION OF AN EMBODIMENT

Figure 1:
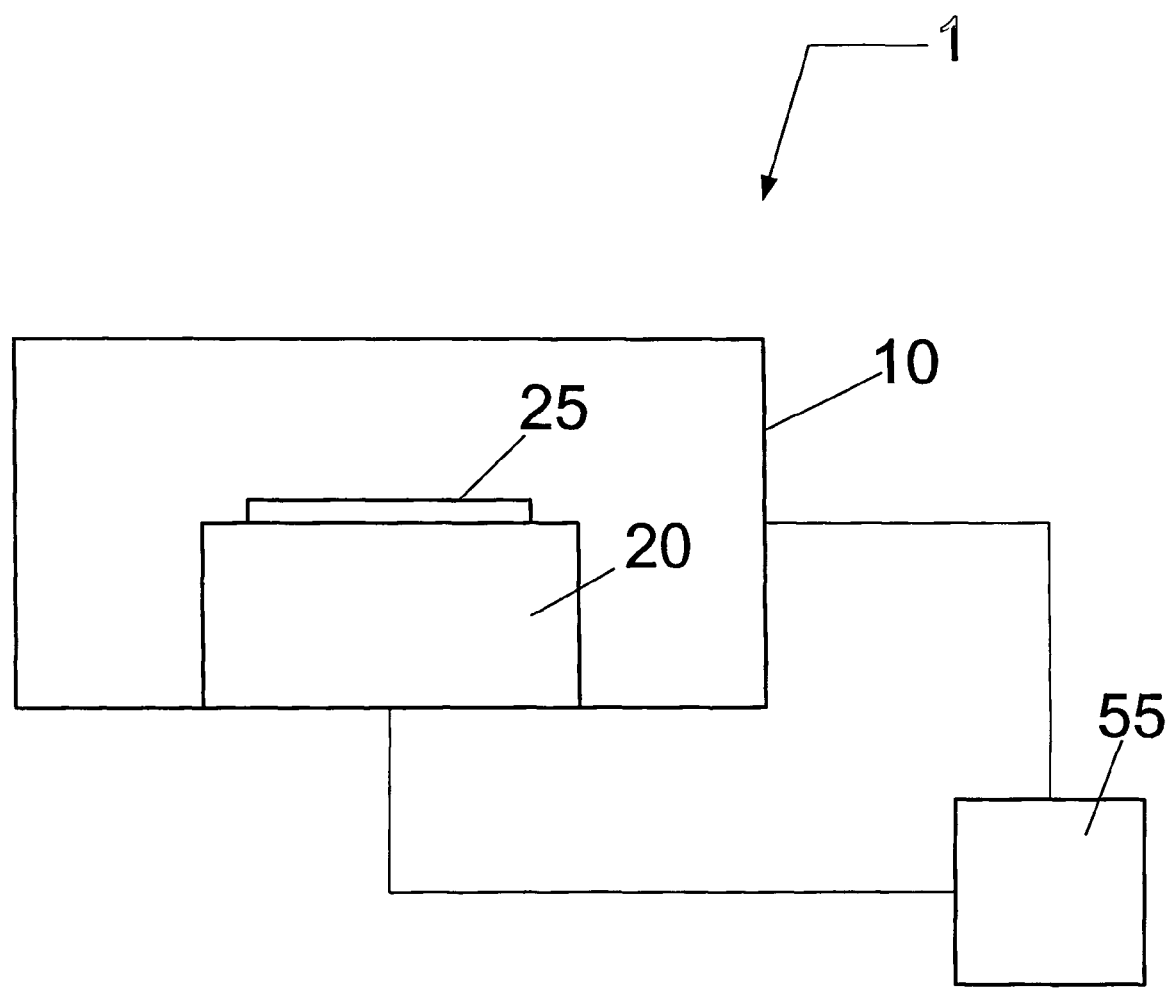
FIG. 1 shows a material processing system according to an embodiment of the present invention.

According to an embodiment of the present invention, a material processing system 1 is depicted in FIG. 1 that includes a process tool 10 having a substrate holder 20 and a substrate 25 supported thereon. The substrate holder 20 is configured to provide temperature control elements for rapid adjustment of substrate temperature, wherein the temperature elements are spatially arranged in order to ensure a uniform substrate temperature. A controller 55 is coupled to the process tool 10 and the substrate holder 20, and is configured to monitor and control the substrate temperature.

In the illustrated embodiment depicted in FIG. 1, the material processing system 1 can include an etch chamber. For example, the etch chamber can facilitate dry plasma etching, or, alternatively, dry non-plasma etching. Alternately, the material processing system 1 includes a photoresist coating chamber such as a heating/cooling module in a photoresist spin coating system that may be utilized for post-adhesion bake (PAB) or post-exposure bake (PEB), etc.; a photoresist patterning chamber such as an ultraviolet (UV) lithography system; a dielectric coating chamber such as a spin-on-glass (SOG) or spin-on-dielectric (SOD) system; a deposition chamber such as a chemical vapor deposition (CVD) system or a physical vapor deposition (PVD) system; or a rapid thermal processing (RTP) chamber such as a RTP system for thermal annealing.

Figure 2:
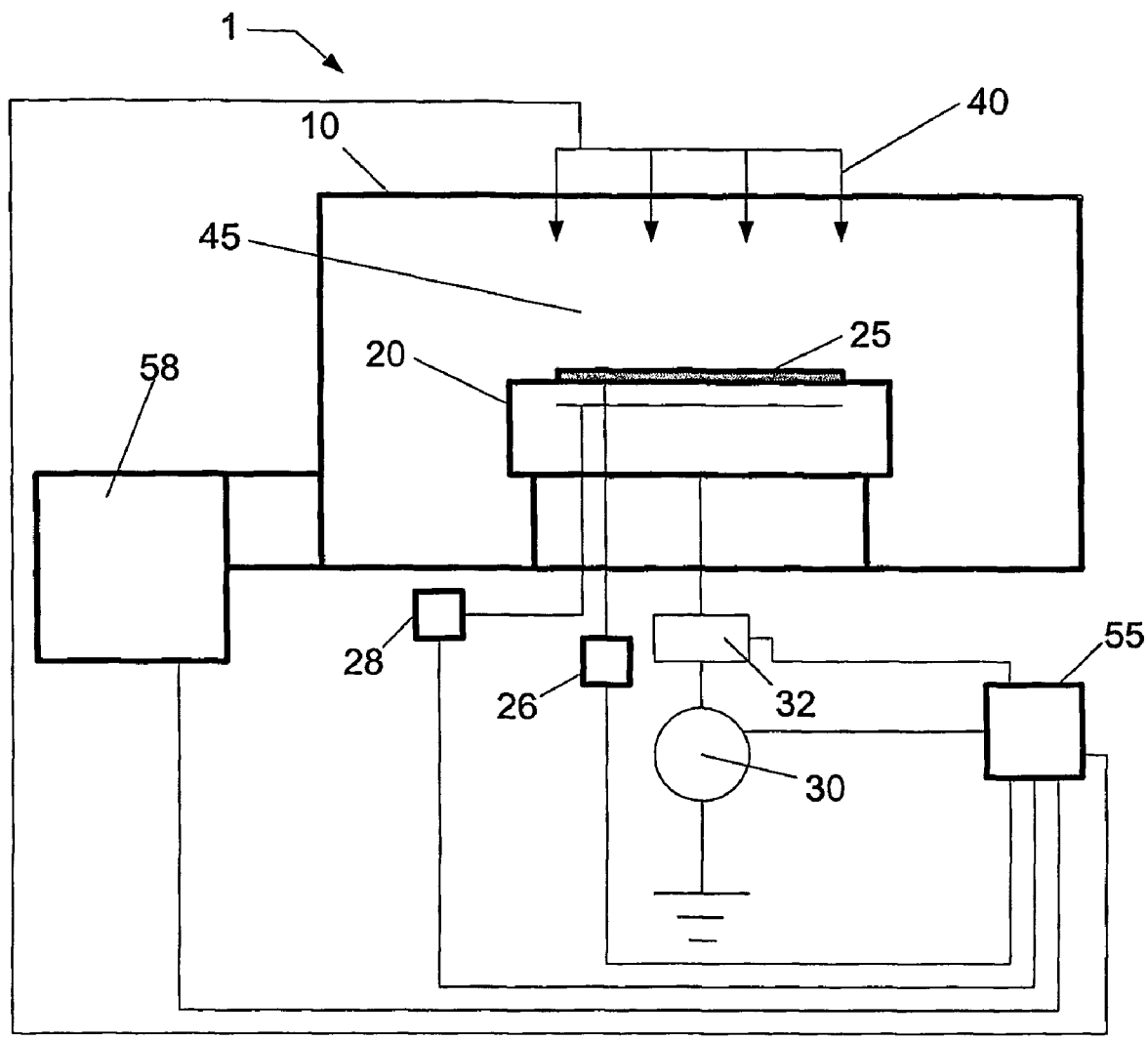
FIG. 2 shows a material processing system according to another embodiment of the present invention.

According to the illustrated embodiment depicted in FIG. 2, the material processing system 1 includes process tool 10, substrate holder 20, upon which a substrate 25 to be processed is affixed, gas injection system 40, and vacuum pumping system 58. Substrate 25 can be, for example, a semiconductor substrate, a wafer, or a liquid crystal display (LCD). Process tool 10 can be, for example, configured to facilitate the generation of plasma in processing region 45 adjacent a surface of substrate 25, where plasma is formed via collisions between heated electrons and an ionizable gas. An ionizable gas or mixture of gases is introduced via gas injection system 40, and the process pressure is adjusted. Desirably, plasma is utilized to create materials specific to a predetermined materials process, and to aid either the deposition of material to substrate 25 or the removal of material from the exposed surfaces of substrate 25. For example, controller 55 can be used to control vacuum pumping system 58 and gas injection system 40.

As shown in FIG. 2, substrate holder 20 can include an electrode through which RF power is coupled to plasma in processing region 45. For example, substrate holder 20 can be electrically biased at an RF voltage via the transmission of RF power from RF generator 30 through impedance match network 32 to substrate holder 20. The RF bias can serve to heat electrons to form and maintain plasma. In this configuration, the system can operate as a reactive ion etch (RIE) reactor, where the chamber and upper gas injection electrode serve as ground surfaces. A typical frequency for the RF bias can range from 1 MHz to 100 MHz and is preferably 13.56 MHz.

Alternately, RF power can be applied to the substrate holder electrode at multiple frequencies. Furthermore, impedance match network 32 serves to maximize the transfer of RF power to plasma in processing chamber 10 by minimizing the reflected power. Various match network topologies (e.g., L-type, $\pi$-type, T-type, etc.) and automatic control methods can be utilized.

With continuing reference to FIG. 2, process gas can be, for example, introduced to processing region 45 through gas injection system 40. Process gas can, for example, include a mixture of gases such as Ar, Kr, Ne, He, $CF_4$, $C_4F_8$, $C_4F_6$, $C_5F_8$, $O_2$, $H_2$, $N_2$, $Cl_2$, $SF_6$, HBr, CO, HF, $NH_3$, etc. Gas injection system 40 includes a showerhead, where process gas is supplied from a gas delivery system (not shown) to the processing region 45 through a gas injection plenum (not shown), a series of baffle plates (not shown) and a multi-orifice showerhead gas injection plate (not shown).

Vacuum pump system 58 can, for example, include a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP is generally employed. TMPs are useful for low pressure processing, typically less than 50 mTorr. At higher pressures, the TMP pumping speed falls off dramatically. For high pressure processing (i.e., greater than 100 mTorr), a mechanical booster pump and dry roughing pump can be used. Furthermore, a device for monitoring chamber pressure (not shown) is coupled to the process chamber 16. The pressure measuring device can be, for example, a Type 628B Baratron absolute capacitance manometer commercially available from MKS Instruments, Inc. (Andover, Mass.).

Figure 3:
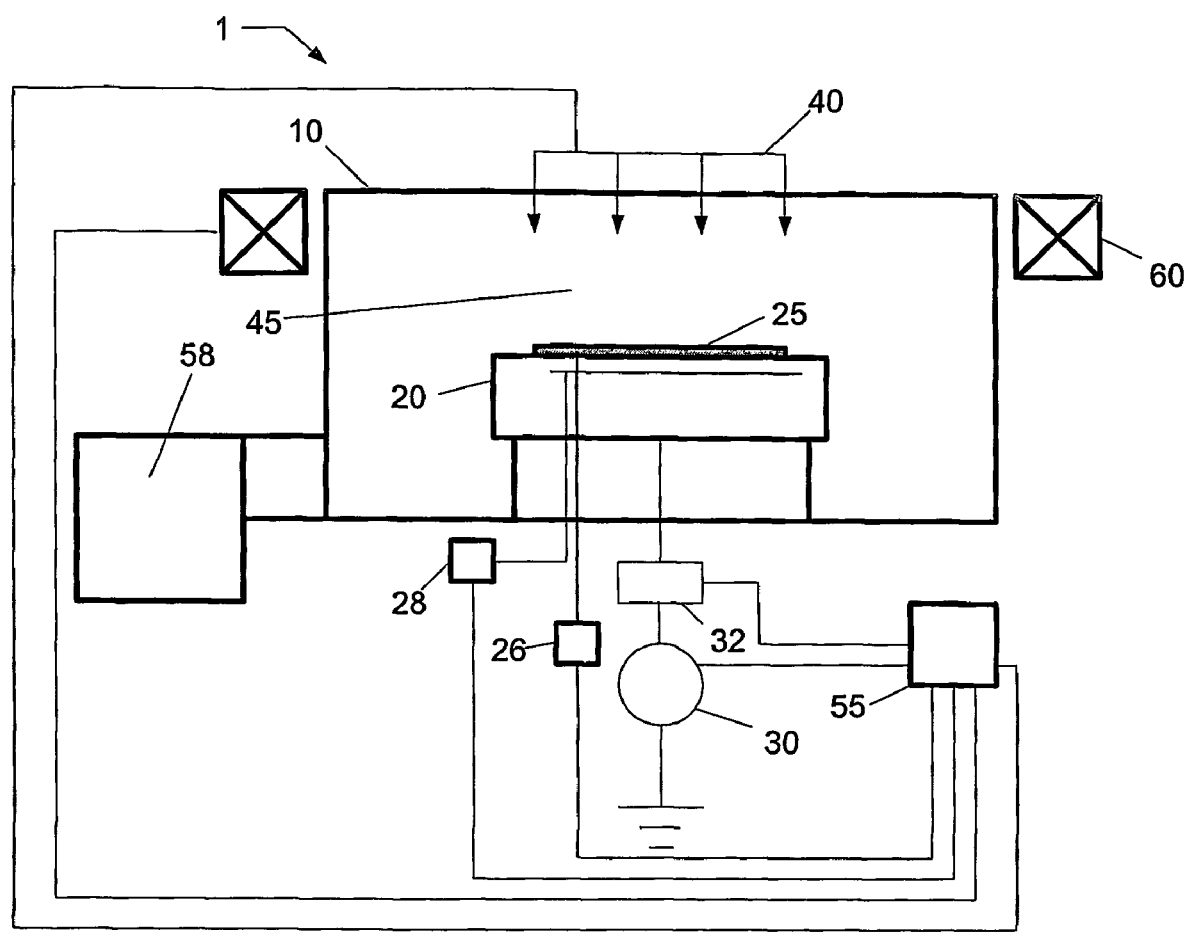
FIG. 3 shows a material processing system according to another embodiment of the present invention.

As shown in FIG. 3, material processing system 1 can include a magnetic field system 60. For example, the magnetic field system 60 can include a stationary, or either a mechanically or electrically rotating DC or AC magnetic field in order to potentially increase plasma density and/or improve material processing uniformity. Moreover, controller 55 can be coupled to magnetic field system 60 in order to regulate the field strength or speed of rotation.

Figure 4:
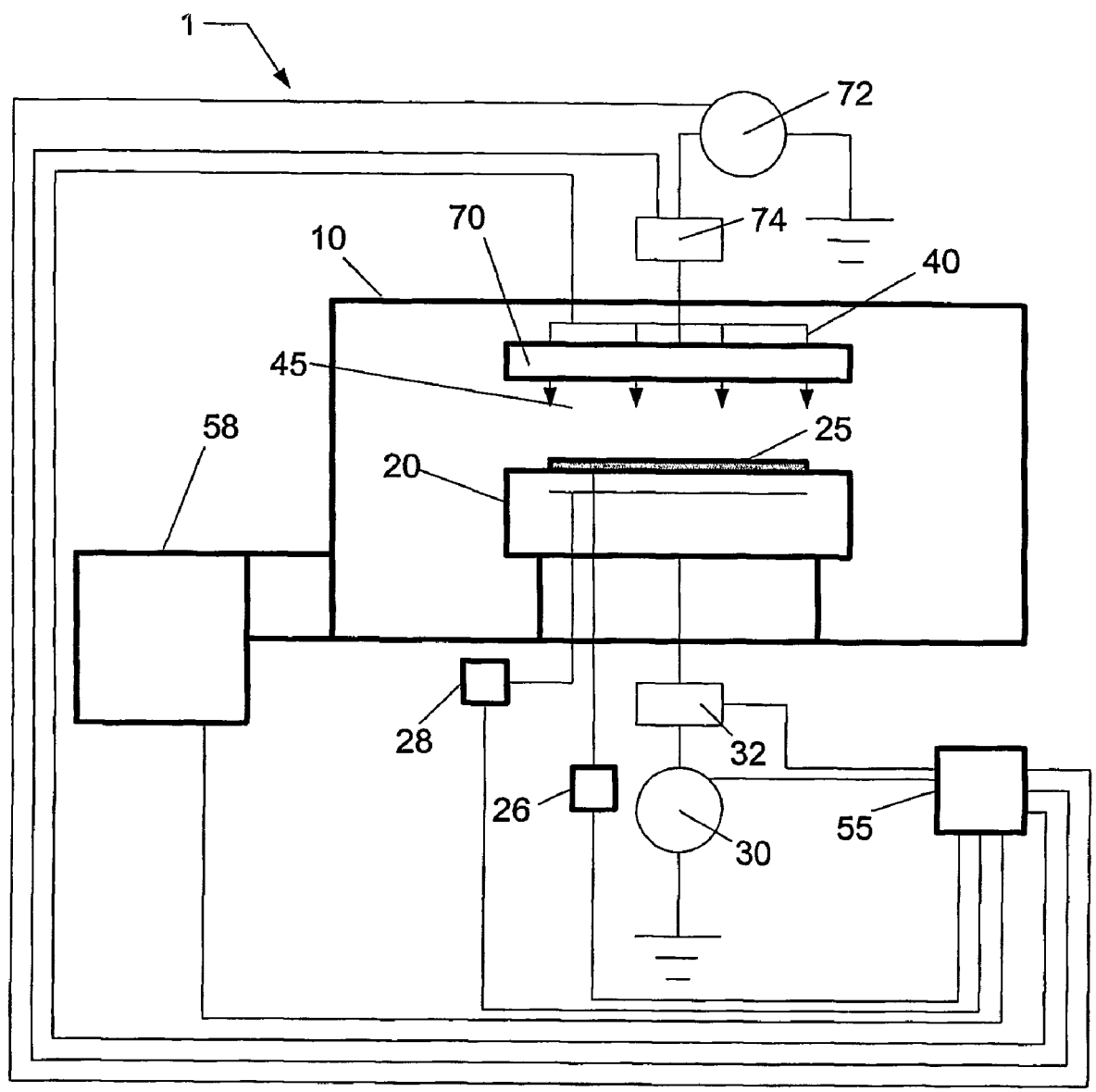
FIG. 4 shows a material processing system according to a further embodiment of the present invention.

As shown in FIG. 4, the material processing system can include an upper electrode 70. For example, RF power can be coupled from RF generator 72 through impedance match network 74 to upper electrode 70. A frequency for the application of RF power to the upper electrode preferably ranges from 10 MHz to 200 MHz and is preferably 60 MHz. Additionally, a frequency for the application of power to the lower electrode can range from 0.1 MHz to 30 MHz and is preferably 2 MHz. Moreover, controller 55 can be coupled to RF generator 72 and impedance match network 74 in order to control the application of RF power to upper electrode 70.

Figure 5:
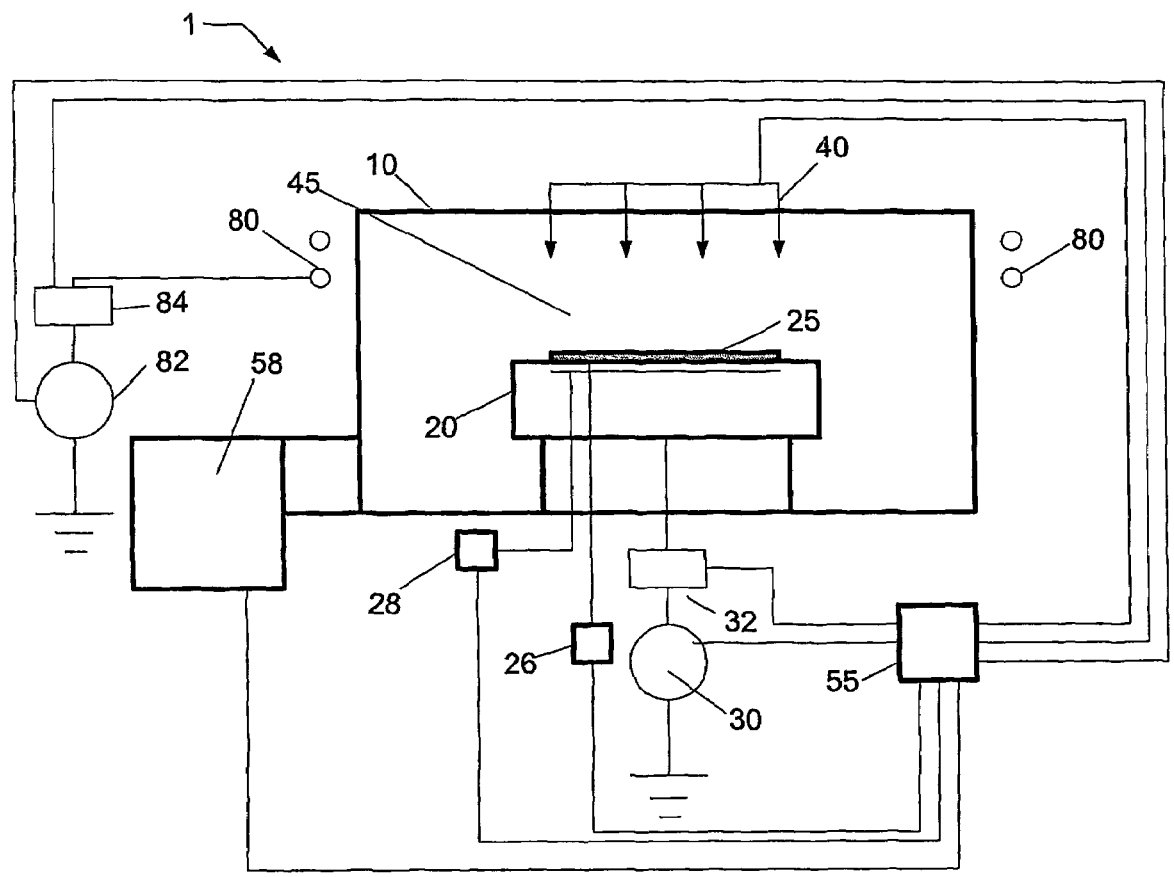
FIG. 5 shows a material processing system according to an additional embodiment of the present invention.

As shown in FIG. 5, the material processing system of FIG. 1 can include an inductive coil 80. For example, RF power can be coupled from RF generator 82 through impedance match network 84 to inductive coil 80, and RF power can be inductively coupled from inductive coil 80 through dielectric window (not shown) to plasma processing region 45. A frequency for the application of RF power to the inductive coil 80 preferably ranges from 10 MHz to 100 MHz and is preferably 13.56 MHz. Similarly, a frequency for the application of power to the chuck electrode preferably ranges from 0.1 MHz to 30 MHz and is preferably 13.56 MHz. In addition, a slotted Faraday shield (not shown) can be employed to reduce capacitive coupling between the inductive coil 80 and plasma. Moreover, controller 55 can be coupled to RF generator 82 and impedance match network 84 in order to control the application of power to inductive coil 80. In an alternate embodiment, inductive coil 80 can be a "spiral" coil or "pancake" coil in communication with the plasma processing region 45 from above as in a transformer coupled plasma (TCP) reactor.

Alternately, the plasma can be formed using electron cyclotron resonance (ECR). In yet another embodiment, the plasma is formed from the launching of a Helicon wave. In yet another embodiment, the plasma is formed from a propagating surface wave.

Figure 6:
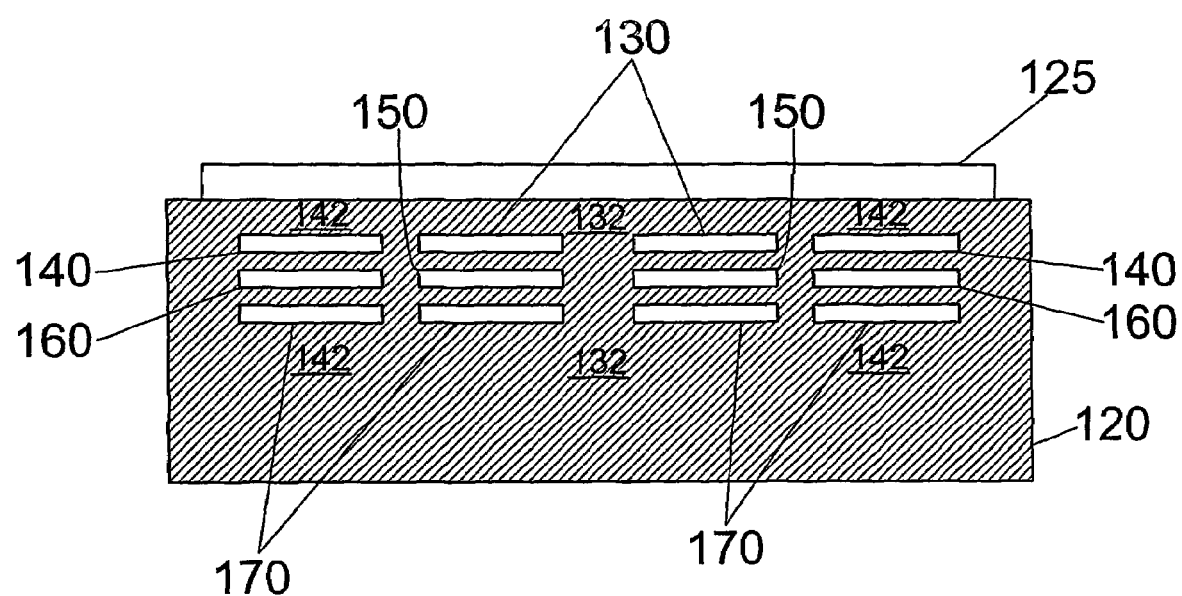
FIG. 6 presents a substrate holder according to an embodiment of the present invention.

In one embodiment, FIG. 6 presents a substrate holder 120 configured for use in any one of the material processing systems 1 described in FIGS. 1 through 5. Substrate holder 120 is configured to support substrate 125, and control the temperature thereof. Substrate holder 120 comprises a first heating element 130 positioned in a central region 132 for elevating the temperature of the central region 132. A second heating element 140 positioned in a peripheral region 142 is concentrically arranged about the first heating element 130 and is configured to elevate the temperature in the peripheral region 142. Furthermore, a first controllably insulating element 150 is positioned below the first heating element 130, and is configured to control the transfer of heat in the central region 132 between the substrate 125 and at least one cooling element 170 positioned therebelow. A second controllably insulating element 160 is positioned below the second heating element 140 and arranged concentrically about the first controllably insulating element 150. It is configured to control the transfer of heat in the peripheral region 142 between the substrate 125 and the at least one cooling element 170 positioned therebelow.

Figure 7:
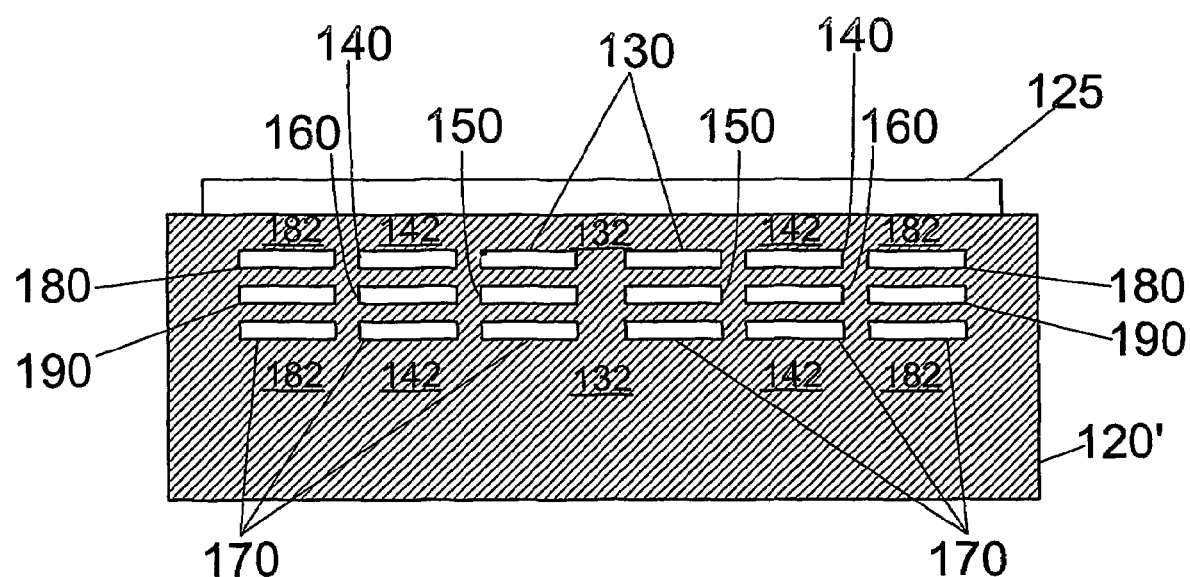
FIG. 7 presents a substrate holder according to another embodiment of the present invention.

In another embodiment, FIG. 7 presents a substrate holder 120' configured for use in any one of the material processing systems 1 described in FIGS. 1 through 5. Substrate holder 10 is configured to support substrate 125, and control the temperature thereof. Substrate holder 120' comprises the elements described in FIG. 6; however, it further comprises a third heating element 180 positioned in a second peripheral region 182 that is concentrically arranged about the second heating element 140 and is configured to elevate the temperature in the second peripheral region 182. A third controllably insulating element 190 is positioned below the third heating element 180 and arranged concentrically about the second controllably insulating element 160. It is configured to control the transfer of heat in the second peripheral region 182 between the substrate 125 and the at least one cooling element 170 positioned therebelow.

In an alternate embodiment, additional (i.e. a fourth, fifth, nth) heating elements and controllably insulating elements, concentrically arranged can be utilized.

In yet another embodiment, the regions need not be concentrically laid out. Instead, any number of region types can be used (e.g., strips, quarters, spirals, wedges).

Figure 8:
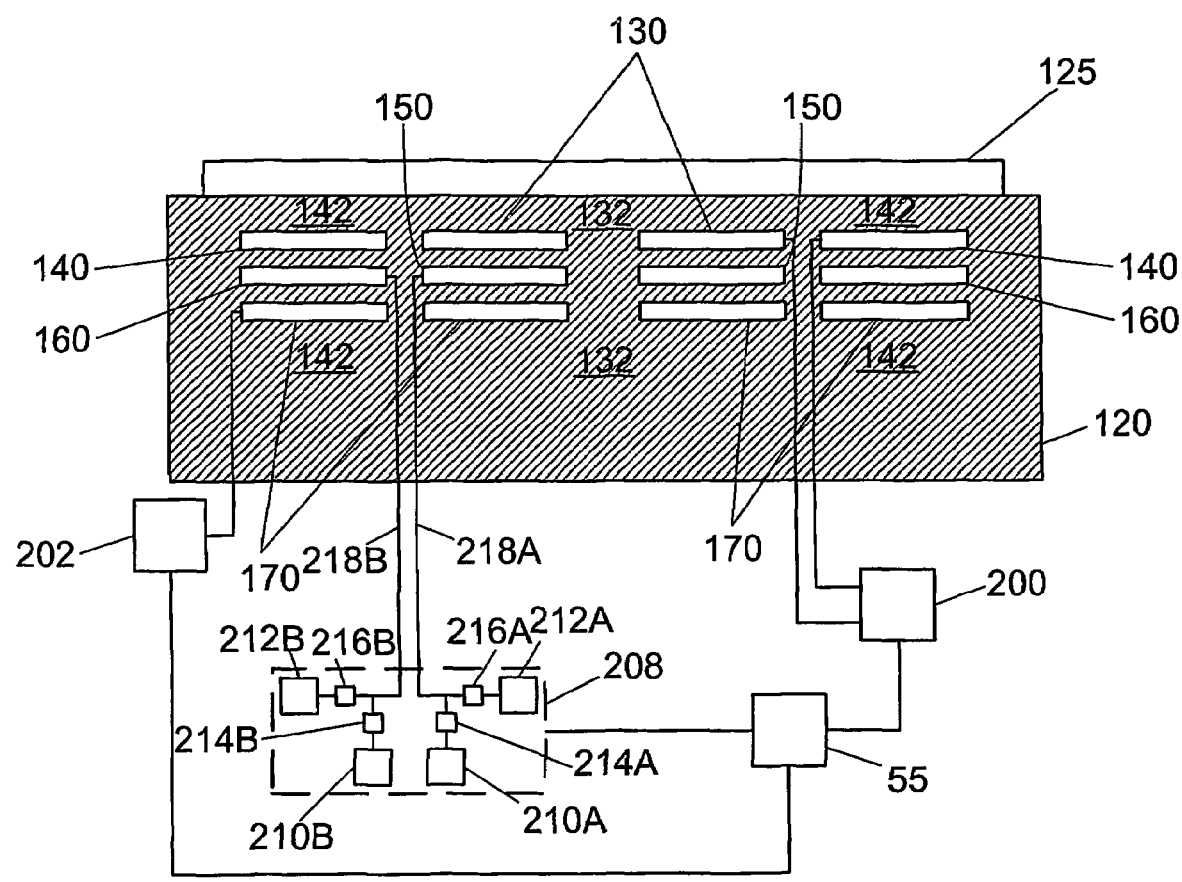
FIG. 8 presents a substrate holder according to another embodiment of the present invention.

Heating elements 130, 140, and 180 can comprise at least one of a heating fluid channel, a resistive heating element, or a thermo-electric element biased to transfer heat towards the wafer. Furthermore, as shown in FIG. 8, heating elements 130, 140, and 180 are coupled to a heating element control unit 200. Heating element control unit 200 is configured to provide either dependent or independent control of each heating element, and exchange information with controller 55. For example, the heating elements can comprise one or more heating channels that can permit a flow rate of a fluid, such as water, Fluorinert, Galden HT-135, etc., therethrough in order to provide conductive-convective heating, wherein the fluid temperature has been elevated via a heat exchanger. The fluid flow rate and fluid temperature can, for example, be set, monitored, adjusted, and controlled by the heating element control unit 200.

Alternatively, for example, the heating elements can comprise one or more resistive heating elements such as a tungsten, nickel-chromium alloy, aluminum-iron alloy, aluminum nitride, etc., filament. Examples of commercially available materials to fabricate resistive heating elements include Kanthal, Nikrothal, Akrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe). For example, the heating elements can comprise a cast-in heater commercially available from Watlow (1310 Kingsland Dr., Batavia, Ill., 60510) capable of a maximum operating temperature of 400 to 450 C, or a film heater comprising aluminum nitride materials that is also commercially available from Watlow and capable of operating temperatures as high as 300 C and power densities of up to 23.25 W/cm$^2$. Additionally, for example, the heating element can comprise a silicone rubber heater (1.0 mm thick) capable of 1400 W (or power density of 5 W/in$^2$). When an electrical current flows through the filament, power is dissipated as heat, and, therefore, the heating element control unit 200 can, for example, comprise a controllable DC power supply. A further heater option, suitable for lower temperatures and power densities, are Kapton heaters, consisted of a filament embedded in a Kapton (e.g. polyimide) sheet, marketed by Minco, Inc., of Minneapolis, Minn.

Alternately, for example, the heating elements can comprise an array of thermo-electric elements capable of heating or cooling a substrate depending upon the direction of electrical current flow through the respective elements. An exemplary thermo-electric element is one commercially available from Advanced Thermo-electric, Model ST-127-1.4-8.5M (a 40 mm by 40 mm by 3.4 mm thermo-electric device capable of a maximum heat transfer power of 72 W). Therefore, the heating element control unit 200 can, for example, comprise a controllable current source.

The at least one cooling element 170 can comprise at least one of a cooling channel, or a thermo-electric element. Furthermore, as shown in FIG. 8, the at least one cooling element 170 is coupled to a cooling element control unit 202. Cooling element control unit 202 is configured to provide either dependent or independent control of the at least one cooling element 170, and exchange information with controller 55. For example, the at least one cooling element can comprise one or more cooling channels that can permit a flow rate of a fluid, such as water, Fluorinert, Galden HT-135, etc., therethrough in order to provide conductive-convective cooling, wherein the fluid temperature has been lowered via a heat exchanger. The fluid flow rate and fluid temperature can, for example, be set, monitored, adjusted, and controlled by the cooling element control unit 202. Alternately, during heating for example, the one or more cooling channels can be drained and evacuated in order to serve as further insulation between the heating elements (described above) and the process tool 10 (as shown in FIG. 1).

Alternately, for example, the at least one cooling element can comprise an array of thermo-electric elements capable of heating or cooling a substrate depending upon the direction of electrical current flow through the respective elements. An exemplary thermo-electric element is one commercially available from Advanced Thermoelectric, Model ST-127-1.4-8.5M (a 40 mm by 40 mm by 3.4 mm thermo-electric device capable of a maximum heat transfer power of 72 W). Therefore, the cooling element control unit 202 can, for example, comprise a controllable current source.

The controllably insulating elements 150, 160, and 190 can comprise a gas gap within which gas properties can be varied in order to vary the heat conductance across the gas gap. Furthermore, as shown in FIG. 8, the controllably insulating elements 150, 160, and 190 are coupled to an insulating element control unit 208. Insulating element control unit 208 is configured to provide either dependent or independent control of each controllably insulating element, and exchange information with controller 55.

For example, as shown in FIG. 8, the insulating element control unit 208 can comprise a first system for affecting the heat conductance through the first controllably insulating element 150 comprising a first gas supply unit 210A and a first vacuum pump 212A coupled to the first controllably insulating element 150 via first gas line 218A through gas flow control devices 214A and 216A, respectively. Similarly, as shown in FIG. 8, the insulating element control unit 208 can further comprise a second system for affecting the heat conductance through the second controllably insulating element 160 comprising a second gas supply unit 210B and a second vacuum pump 212B coupled to the second controllably insulating element 160 via second gas line 218B through gas flow control devices 214B and 216B, respectively. Gas supply units 210A, 210B can, for example, supply a heat transfer gas such as helium. Alternately, the first controllably insulating element 150 and the second controllably insulating element 160 are coupled to the same gas supply unit and vacuum pump. Alternately, the first and second controllably insulating elements 150, 160 can be evacuated through a vacuum line as part of vacuum pumping system 58 as shown in FIGS. 2 through 5.

The thermal conductance of each controllably insulating element can be affected by the physical dimensions of the insulating element (i.e. thickness of the gap), the type of gas present within the insulating element, and the pressure of the gas within the insulating element, as well as other parameters. For example, Table 1 illustrates the approximate dependence of the heat conductance (or heat transfer coefficient) across a gas gap as a function of the gap thickness $\delta$ and the gas pressure p for helium.

TABLE 1

| h (W/m²K) | p = 1 Torr | p = 10 Torr | p = 100 Torr | p = 1000 Torr |
|---|---|---|---|---|
| δ = 0.005 mm | 90 | 1000 | 7500 | 30000 |
| 0.05 mm | 90 | 750 | 2500 | 3500 |
| 0.5 mm | 70 | 250 | 400 | 400 |
| 5 mm | 15 | 35 | 40 | 40 |

From inspection of Table 1, the smaller the gap thickness, the greater the variation in heat conductance for a gas pressure from 1 to 1000 Torr. For example, a 50 micron gap (0.05 mm) can provide a relatively high heat conductance when pressurized to approximately one atmosphere (1000 Torr), and a relatively low heat conductance when evacuated to approximately a thousandth of an atmosphere (1 Torr).

Figure 9:
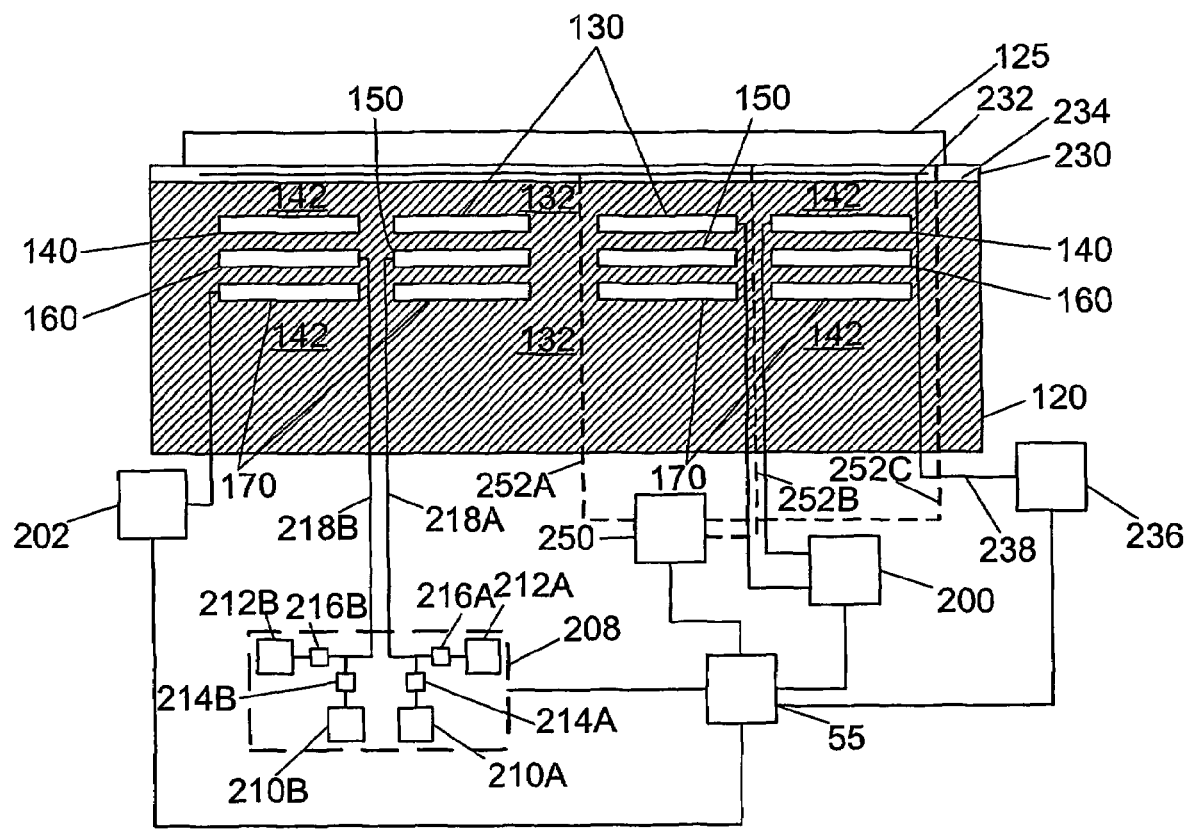
FIG. 9 presents a substrate holder according to another embodiment of the present invention.

Additionally, as shown in FIG. 9, the substrate holder 120, 120' can further comprise an electrostatic clamp (ESC) 230 comprising a ceramic layer 234, one or more clamping electrodes 232 embedded therein, and a high-voltage (HV) DC voltage supply 236 coupled to the clamping electrodes 232 via an electrical connection 238. The design and implementation of such a clamp is well known to those skilled in the art of electrostatic clamping systems. Furthermore, the HV DC voltage supply 236 is coupled to controller 55 and is configured to exchange information with controller 55.

Referring still to FIG. 9, the substrate holder 120, 120' can further comprise a back-side gas supply system 250 for supplying a heat transfer gas, such as an inert gas including helium, argon, xenon, krypton, a process gas, or other gas including oxygen, nitrogen, or hydrogen, to the backside of substrate 125 through at least one gas supply line 252A, B, C, and at least one of a plurality of orifices and channels (not shown). The backside gas supply system 250 can, for example, be a multi-zone supply system such as a two-zone (center—252A, edge—252C) system, or a three-zone (center—252A, mid-radius—252B, edge—252C), wherein the backside pressure can be varied radially from the center to edge.

Figure 10:
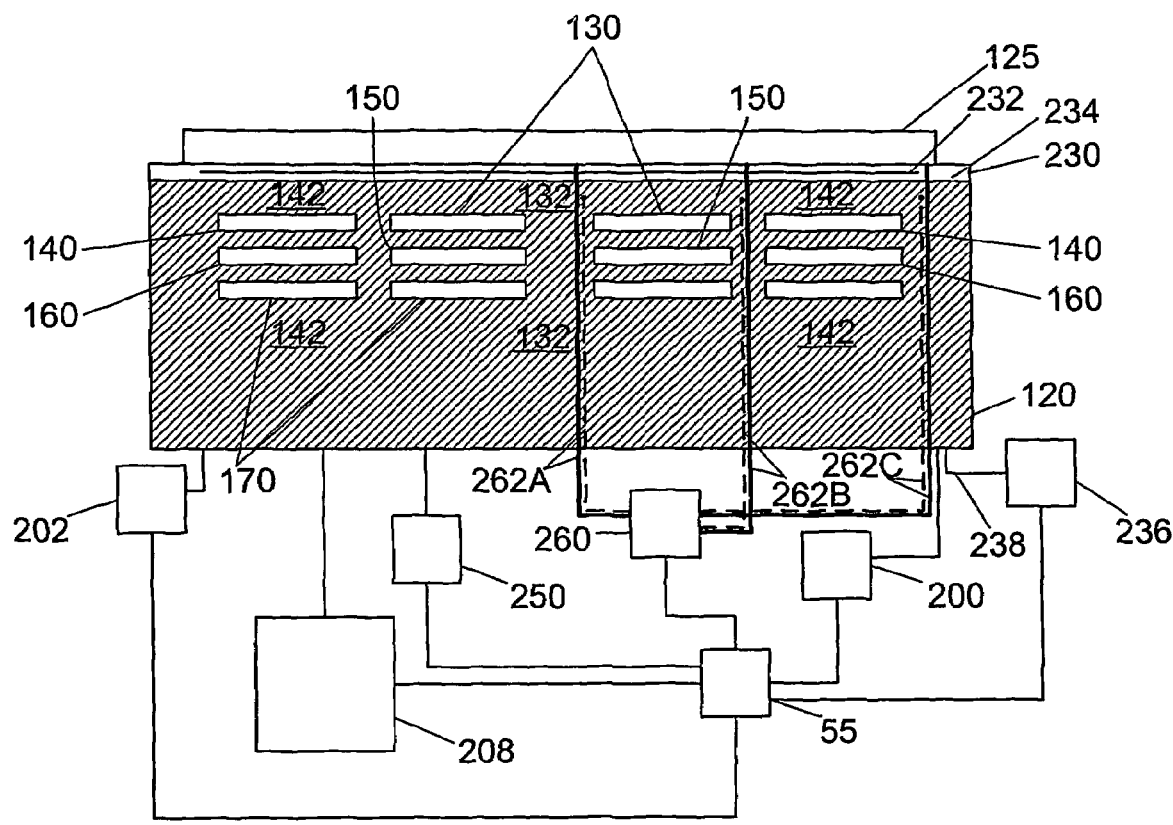
FIG. 10 presents a substrate holder according to another embodiment of the present invention.

In another embodiment, as shown in FIG. 10, the temperature of substrate 125 can be monitored with a monitoring system 260 at one or more locations using one or more temperature-sensing devices 262A, 262B, 262C, such as an optical fiber thermometer commercially available from Advanced Energies, Inc. (1625 Sharp Point Drive, Fort Collins, Colo., 80525), Model No. OR2000F capable of measurements from 50 to 2000 C and an accuracy of plus or minus 1.5 C, a band-edge temperature measurement system as described in pending U.S. patent application Ser. No. 10/168,544, filed on Jul. 2, 2002, the contents of which are incorporated herein by reference in their entirety, or a thermocouple (as indicated by the dashed line) such as a K-type thermocouple. The monitoring system 260 can provide sensor information to controller 55 in order to adjust at least one of a heating element, a cooling element, a controllably insulating element, a backside gas supply system, and an HV DC voltage supply for an ESC either before, during, or after processing.

Furthermore, for example, substrate 25, 125 can be transferred into and out of process tool 10 through a slot valve (not shown) and chamber feed-through (not shown) via robotic substrate transfer system where it is received by substrate lift pins (not shown) housed within substrate holder 20, 120, 120' and mechanically translated by devices housed therein. Once substrate 25, 125 is received from substrate transfer system, it is lowered to an upper surface of substrate holder 20, 120, 120'.

Controller 55 includes a microprocessor, memory, and a digital I/O port (potentially including D/A and/or A/D converters) capable of generating control voltages sufficient to communicate and activate inputs to material processing system 1 as well as monitor outputs from material processing system 1. As shown in FIGS. 8 and 9, controller 55 can be coupled to and exchange information with heating element control unit 200, cooling element control unit 202, insulating element control unit 208, HV DC voltage supply 236, and backside gas supply system 250. A program stored in the memory is utilized to interact with the aforementioned components of a material processing system 1 according to a stored process recipe. One example of controller 55 is a DELL PRECISION WORKSTATION 640™, available from Dell Corporation, Austin, Tex.

Figure 11:
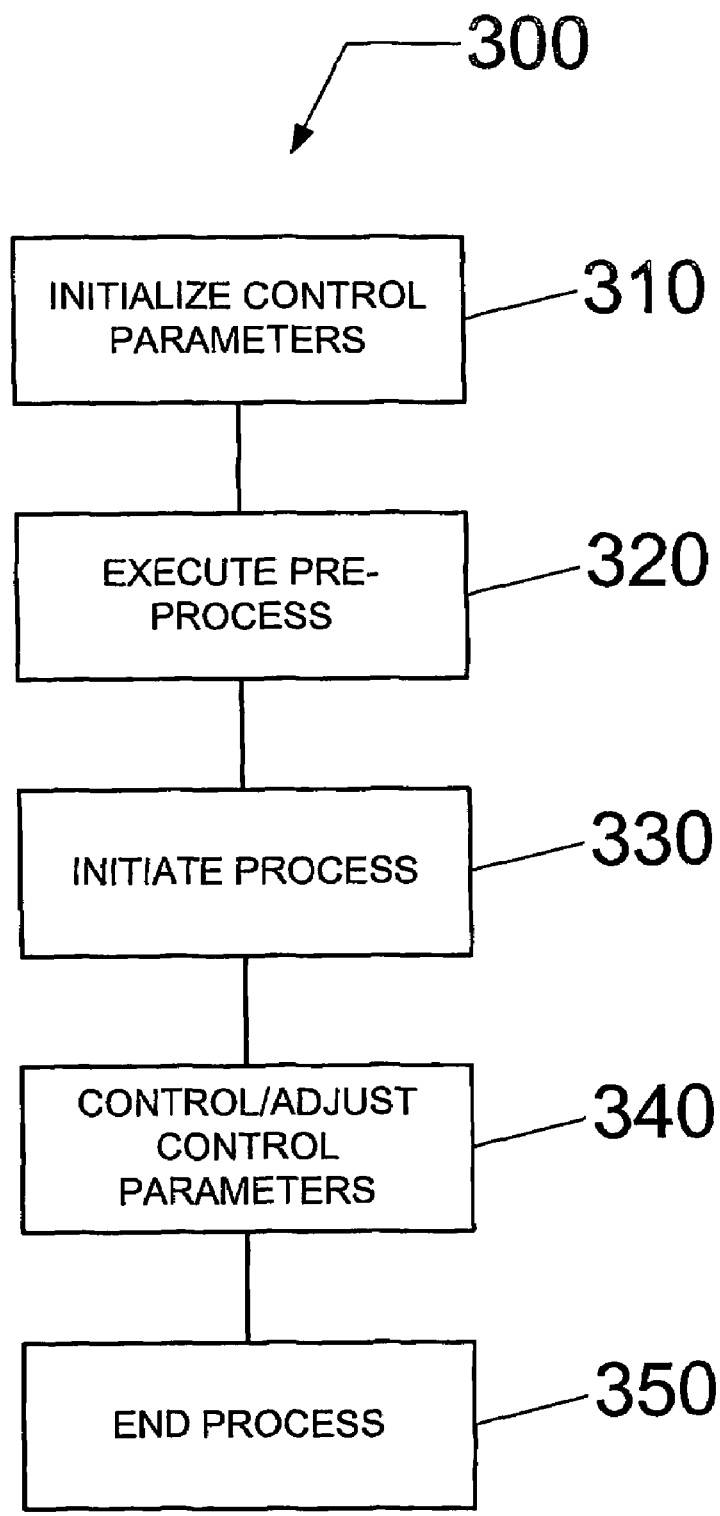
FIG. 11 presents a method of controlling the temperature of a substrate on a substrate holder in a processing system according to an embodiment of the present invention.

FIG. 11 presents a flowchart describing a method 300 of controlling the temperature of a substrate on a substrate holder in a processing system. For example, the temperature control scheme can pertain to multiple process steps for a process in the processing system. The substrate holder comprises one of those described in FIGS. 6 through 10. The method 300 begins in 310 with initializing the control parameters for controlling the temperature of the substrate. The control parameters comprise the input parameters for the first heating element, the input parameters for the second heating element, the input parameters for the first controllably insulating element, the input parameters for the second controllably insulating element, and the input parameters to the at least one cooling element. The control parameters can further comprise the input parameters for the electrostatic clamp HV DC voltage supply, and the input parameters for the backside gas supply system. The input parameters for the first and second heating elements can, for example, comprise a voltage or current for a resistive heating element, a fluid flow rate or fluid temperature for a heating channel, or a current or polarity for a thermo-electric element. The input parameters for the first and second controllably insulating elements can, for example, comprise a gas gap gas type or a gas gap gas pressure. The input parameters for the at least one cooling element can, for example, comprise a fluid flow rate or a fluid temperature for a cooling channel, or a voltage, current or polarity for a thermo-electric element. The input parameters for an ESC can, for example, comprise a clamp voltage. The input parameters for a backside gas supply system can, for example, comprise a backside flow rate, a backside gas pressure, or a backside gas type.

In 320, the control parameters established in 310 can be set in order to perform at least one of pre-processing the substrate, the substrate holder, or the processing system.

In 330, a process is initiated in the processing system for treating the substrate, and, in 340, the control parameters are controlled and/or adjusted. The control parameters can be controlled and/or adjusted according to a pre-determined process recipe. Alternately, the control parameters can be controlled and/or adjusted according to a comparison of temperature measurements using temperature sensing devices with process conditions dictated by a process recipe. Alternately, the control parameters can be controlled and/or adjusted according to a combination of a pre-determined process recipe and a comparison of temperature measurements using temperature sensing devices with process conditions dictated by a process recipe.

In 350, the process is terminated, and, thereafter, the control parameters can, optionally, be controlled and/or adjusted in order to post-process at least one of the substrate, the substrate holder, or the processing system.

In an example, such as one encountered in plasma processing, a process for treating a substrate can comprise treatment at an elevated substrate temperature. During such a process, the substrate temperature can be rapidly elevated to a target temperature and the process can be initiated. For example, utilizing a substrate holder, such as the one described in FIG. 10, the first and second heating elements can comprise separate resistive heating elements, each of which is either dependently or independently coupled to an electrical current source. During pre-processing, an electrical current (equivalent to, for example, 15 kW of power) can be applied to the first and second heating elements to facilitate heating of the substrate, and the first and second insulating elements can be evacuated (to, for example, 1 Torr helium gas pressure) to thermally insulate the first and second heating elements from the at least one cooling element. Thereafter, the process can be initiated by flowing process gases into the processing system and generating a plasma. Upon initiation of the process, electrical current to the first and second heating elements can be terminated, and the first and second insulating elements can be restored to atmospheric pressure to aid cooling of the substrate and balance the plasma heat flux to the substrate. The process can be initiated at any time during substrate temperature ramp from its nominal temperature to the target temperature. During processing, any one of the above identified control parameters can be monitored, adjusted, or controlled.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A substrate holder for supporting a substrate in a processing system and controlling the temperature thereof comprising:
   a first heating element arranged in a first region of said substrate holder and configured to raise the temperature in said first region;
   a second heating element arranged in a second region of said substrate holder and configured to raise the temperature in said second region;
   a first cooling element arranged in said substrate holder opposing said first heating elements with a space therebetween;
   a second cooling element arranged in the substrate holder opposing the second heating element with a space therebetween;
   an insulating element arranged in said substrate holder interposed in the space between each cooling element and the opposing first and second heating elements, wherein said insulating element is configured to control the transfer of heat from said substrate through said substrate holder to said at least one cooling element.

2. The substrate holder as recited in claim 1 further comprising a first intermediate space arranged between said first region and said second region, and configured to permit the transfer of heat between said substrate and said cooling elements.

3. The substrate holder as recited in claim 1, wherein said second region is located concentrically around the first region which is centrally located, said substrate holder further comprising:
   a third heating element concentrically arranged about said second heating element in a third region of said substrate holder and configured to raise the temperature in said third region.

4. The substrate holder as recited in claim 1, wherein said first and second heating elements comprise at least one of a resistive heating element, a heating channel, and a thermo-electric element.

5. The substrate holder as recited in claim 1, wherein at least one cooling element comprises at least one of a cooling channel, and a thermo-electric element.

6. The substrate holder as recited in claim 1, wherein said insulating element comprises a gas gap coupled to at least one of a vacuum pump and a gas supply unit.

7. The substrate holder as recited in claim 1 further comprising at least one of an electrostatic clamp for clamping said substrate to said substrate holder, and a backside gas supply system for increasing the thermal conductance between said substrate and said substrate holder.

8. The substrate holder as recited in claim 1 further comprising at least one temperature sensing device.

9. The substrate holder as recited in claim 8, wherein said temperature sensing device comprises at least one of an optical thermometer, and a thermocouple.

10. The substrate holder as recited in claim 1 further comprising a controller coupled to at least one of said first heating element, said second heating element, said insulating element and said cooling elements.

11. The substrate holder as recited in claim 1, wherein the first region is a central region and a second region is a peripheral region concentrically arranged about said first region.

12. The substrate holder as recited in claim 1, wherein the first and second regions are adjacent.

13. The substrate holder of claim 1, wherein said insulating element comprises:
   a first controllably insulating element interposed between the first heating element and the cooling element in the first region; and
   a second controllably insulating element interposed between the second heating element and the cooling element in the second region,
   wherein said first controllably insulating element is configured to control the transfer of heat from said substrate through said first region of said substrate holder to said first cooling element, and said second controllably insulating element is configured to control the transfer of heat between said substrate through said second region of said substrate holder to said second cooling element.

14. The substrate holder of claim 1, wherein said insulating element comprises a single insulating element.

15. The substrate holder of claim 1, wherein said insulating element comprises a plurality of insulating elements that are dependently controlled.

16. A method of controlling the temperature of a substrate using a substrate holder in a processing system comprising:
   initializing one or more control parameters for controlling the temperature of said substrate using said substrate holder, said substrate holder comprising a first heating element arranged in a first region of said substrate holder, a second heating element arranged in a second region of said substrate holder, cooling elements arranged in said substrate holder opposing each of said first and second heating elements with a space therebetween, and an insulating element arranged in said substrate holder interposed in the space between each of the cooling elements and the opposing first and second heating elements;

initiating a process in said processing system;

adjusting said one or more control parameters; and terminating said process.

17. The method as recited in claim 16 further comprising a first intermediate space arranged between said first region and said second region, and configured to permit the transfer of heat between said substrate and said cooling elements.

18. The method as recited in claim 16, wherein said second region is located concentrically around the first region which is centrally located, further comprising:

a third heating element concentrically arranged about said second heating element in a third region of said substrate holder.

19. The method as recited in claim 16, wherein said first and second heating elements comprise at least one of a resistive heating element, a heating channel, and a thermo-electric element.

20. The method as recited in claim 16, wherein said cooling elements comprises at least one of a cooling channel, and a thermo-electric element.

21. The method as recited in claim 16, wherein said insulating element comprises a gas gap coupled to at least one of a vacuum pump and a gas supply unit.

22. The method as recited in claim 16, further comprising at least one temperature sensing device.

23. The method as recited in claim 22, wherein said temperature sensing device comprises at least one of an optical thermometer, and a thermocouple.

24. The method as recited in claim 16 further comprising a controller coupled to at least one of said first heating element, said second heating element, said insulating element, and said cooling elements.

25. The method as recited in claim 24, wherein said controller facilitates at least one of setting, monitoring, adjusting, and controlling said one or more control parameters.

26. The method as recited in claim 16, wherein said one or more control parameters comprise at least one of a resistive heating element voltage, a resistive heating element current, a heating channel fluid flow rate, a heating channel fluid temperature, a thermo-electric element current, a thermo-electric element polarity, a gas gap gas type, a gas gap gas pressure, a cooling channel fluid flow rate, and a cooling channel fluid temperature.

27. The method as recited in claim 16 further comprising at least one of an electrostatic clamp for clamping said substrate to said substrate holder, and a backside gas supply system for increasing the thermal conductance between said substrate and said substrate holder.

28. The method as recited in claim 27, wherein said one or more control parameters comprise at least one of an electrostatic clamp voltage, a backside gas type, and a backside gas pressure.

29. The method as recited in claim 27, wherein said backside gas supply system is at least one of a two-zone backside gas supply system, and a three-zone backside gas supply system.

30. The method as recited in claim 16 further comprising:

initiating a pre-process in said processing system following said initializing said one or more control parameters.

31. The method as recited in claim 30 further comprising: adjusting said one or more control parameters during said pre-process.

32. The method as recited in claim 30 further comprising: adjusting said one or more control parameters following said pre-process, and preceding said process.

33. The method as recited in claim 16 further comprising: initiating a post-process in said processing system following said terminating said process.

34. The method as recited in claim 22 further comprising: adjusting said one or more control parameters during said post-process.

35. The method as recited in claim 22 further comprising: adjusting said one or more control parameters preceding said post-process, and following said process.

36. The method as recited in claim 16, wherein the first region is a central region and a second region is a peripheral region concentrically arranged about said first region.

37. The method as recited in claim 16, wherein the first and second regions are adjacent.

38. The method of claim 16, wherein said insulating element comprises:

a first controllably insulating element interposed between the first heating element and the first cooling element in the first region; and a second controllably insulating element interposed between the second heating element and the second cooling element in the second region.

39. The method of claim 16, wherein said insulating element comprises a single insulating element.

40. The method of claim 16, wherein said insulating element comprises a plurality of insulating elements that are dependently controlled.

* * * * *